United States Patent [19]

Conway et al.

[11] 4,069,452
[45] Jan. 17, 1978

[54] APPARATUS FOR AUTOMATICALLY DETECTING VALUES OF PERIODICALLY TIME VARYING SIGNALS

[75] Inventors: Arch W. Conway, Mission Viejo; Nelson Urdaneta, La Verne, both of Calif.

[73] Assignee: Dana Laboratories, Inc., Irvine, Calif.

[21] Appl. No.: 723,393

[22] Filed: Sept. 15, 1976

[51] Int. Cl.² .................. G01R 19/16; H03K 5/20
[52] U.S. Cl. .............................. 324/103 P; 307/351
[58] Field of Search ............ 324/103 P, 103 R, 99 D, 324/111, 115; 307/235 A, 351

[56] References Cited
U.S. PATENT DOCUMENTS

3,221,253  11/1965  Keyes ........................... 324/103 P

Primary Examiner—Rudolph V. Rolinec
Assistant Examiner—Ernest F. Karlsen
Attorney, Agent, or Firm—Nilsson, Robbins, Dalgarn, Berliner, Carson & Wurst

[57] ABSTRACT

Apparatus which automatically measures the range and the lower and upper peak values of an unknown signal which varies periodically as a function of time. More specifically, an unknown time varying input signal is applied through a programmable attenuator to one input of a comparator. A direct current voltage which changes in equal incremental steps between predetermined levels is applied to the other input of the comparator. When coincidence occurs an output signal is developed by the comparator responsive thereto. The output signal thus developed is utilized to maintain the attenuator at the range level to which it was set when the coincidence was detected and also causes the reference level applied to the comparator to sequentially change in such a manner as to ascertain the lower and upper peak values of the applied signal. The upper and lower peak values when determined are applied to a storage means and subsequently to an arithmetic computer means to ascertain predetermined values of the applied signal which values are then displayed in a display means.

15 Claims, 8 Drawing Figures

APPARATUS FOR AUTOMATICALLY DETECTING VALUES OF PERIODICALLY TIME VARYING SIGNALS

BACKGROUND OF THE INVENTION

Timer-counter apparatus is well known in the prior art and is utilized to measure the voltage-time characteristics of applied unknown signals which vary periodically as a function of time. These signals provide information useful in many applications. For example, speed, phase, revolutions per minute, frequency and the like may be ascertained therefrom. Such is normally accomplished in timer-counters by measuring the frequency of the occurrence of the electrical signal applied, the period of elapsed time between certain electrical events as they occur and the time displacement between two predetermined points on a particular electrical signal as applied.

To accurately measure these events, or elapsed time, requires an accurate setting within the instrument of a reference level against which the input signal may be compared to thereby provide an output or trigger signal when the input wave form achieves a predetermined relationship with the reference level.

In the prior art, to properly ascertain the position where the reference level was to be set required users of the instruments to make measurements with external equipment such as voltmeters or oscilloscopes to ascertain generally the appearance of the input wave form and its general value before the timer-counter instrument could in fact be used. As an alternative, the users of the prior art instruments could "hunt" with the reference level setting controls on the instruments and periodically make measurements with the instruments to obtain such generalized information.

Obviously such prior art techniques require the utilization of additional instruments and consume additional operator time, both of which are extremely expensive, unnecessary and often lead to operator error.

SUMMARY OF THE INVENTION

In accordance with the present invention, there is provided an apparatus for automatically detecting the peak values of an applied unknown electrical signal which varies periodically with time including a comparator to which the unknown signal is applied. A reference voltage is also applied to the comparator and is generated by a means for providing a sequentially changing direct current voltage with the changes occurring in predetermined equal increments. Upon coincidence of a first predetermined relationship between the unknown signal and the reference signal the comparator provides a first signal at the output terminal thereof which is representative of one peak of the unknown signal. Upon the occurrence of a second predetermined relationship between the reference level signal and the unknown signal the comparator provides a second output signal representative of the other peak of the unknown signal.

In accordance with a more specific aspect of the present invention the incrementally changing reference level applied to the comparator is swept through the signal ranges for which the instrument is designed. At the same time the input signal is applied through a programmable attenuator to the comparator. When coincidence first occurs between the reference level and the input signal, the output signal from the comparator is representative of the appropriate range of the input signal applied to the instrument. Thereafter a reference level signal is then swept through that appropriate range in coarse steps until one peak of the input wave form is detected. At this stage the reference level voltage applied to the comparator is then swept through the coarse step at which the signal was detected but in fine steps to ascertain the value of the particular peak of the input wave form. The other peak is similarly obtained and the values of each of the peak of the input signal are then stored in an appropriate storage means and are evaluated in such a manner as to determine a desired trigger setting level which is then automatically applied as a reference level to the comparator for further measurements and operations as may be desired for the particular application to which the timer-counter is being put.

DETAILED DESCRIPTION OF THE INVENTION

Figures 1, 2:
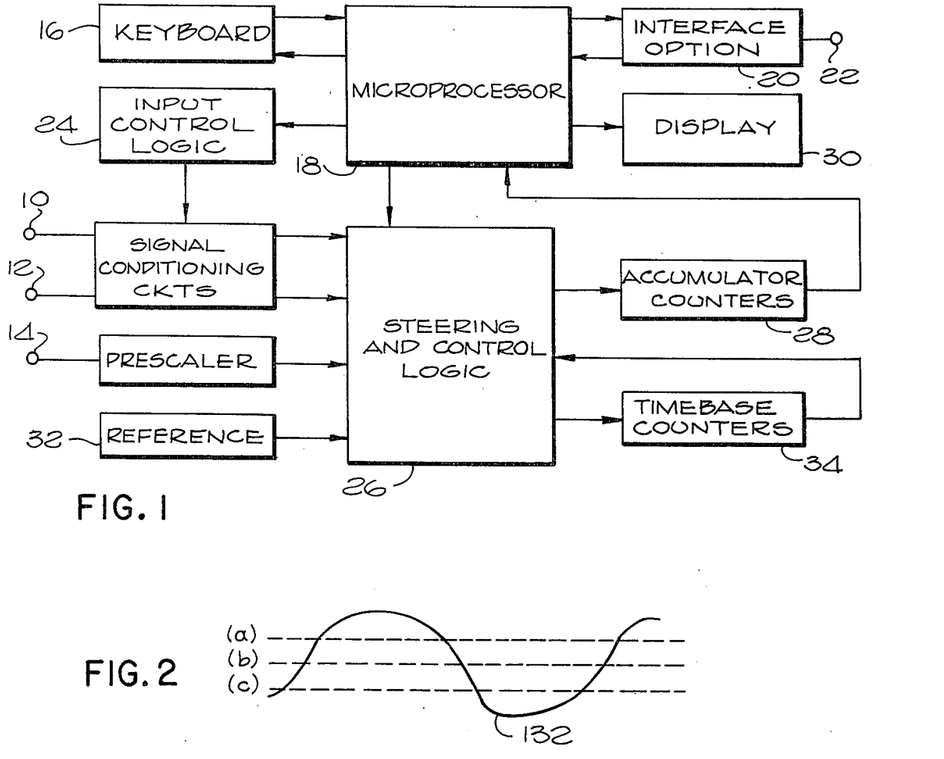
FIG. 1 is a generalized block diagram of a timer-counter instrument which includes the automatic peak detecting apparatus of the present invention.
FIG. 2 is a schematic diagram illustrating a typical wave form of an electrical signal which would be applied to an instrument of the type illustrated in FIG. 1.

A timer-counter within which apparatus constructed in accordance with the present invention is utilized is illustrated in generalized block diagram form in FIG. 1. As is therein shown, an unknown signal is applied to input terminals 10, 12 and 14 depending upon the particular measurement or other information which is desired. A keyboard 16 may be used to manually instruct a microprocessor 18 as to the particular operations to be performed. Alternatively, through the utilization of an interface option 2, an external electronic data processing equipment may be affixed to the instrument by way of the terminal 22. Such external equipment would function in the same fashion as the keyboard 16 to instruct the microprocessor 18. Through the utilization of the input control logic 24 and the steering and control logic 26, appropriate measurements are made and counts taken which are then stored in the accumulator counters 28. The information in the accumulator counters 28 is then retrieved by he microprocessor and displayed on the display 30. The reference 32 and time base counters 34 are utilized to provide additional operating requirements for the timer-counter apparatus.

Through the utilization of a timer-counter apparatus such as that illustrated in FIG. 1, an electrical input signal which varies with respect to time such as that illustrated in FIG. 2 may be automatically measured to determine various information contained therein. For example, by appropriately setting the controls within the timer-counter apparatus to detect the mid-point of the wave form of FIG. 2, such as is illustrated at (b), only when the wave form is positive going, the frequency of the signal may be determined. Likewise, by appropriately setting the controls within the instrument to detect such things as the time elapsing between the occurrence of certain electrical events contained within the wave form of FIG. 2, such as the time required to pass between the occurrence of the wave form at point (c) to point (a) can provide additional information of value under certain applications. To accomplish such measurement the instrument would be adjusted by setting a trigger level to detect these electrical events as they occur. When detected, the timing information obtained may then be utilized for further calculations within the microprocessor 18 to provide the desired useful information.

Obviously, to accomplish the analysis of an unknown wave form, such as that illustrated in FIG. 2, which is applied to the instrument as is illustrated in FIG. 1, requires knowledge of the general configuration of the wave form such as its absolute magnitude, the peak to peak value thereof and the like. The present invention provides apparatus for automatically ascertaining such information and then setting the trigger or reference level voltages at the desired predetermined points such, for example, as at mid-point (b) of FIG. 2.

Figure 3:
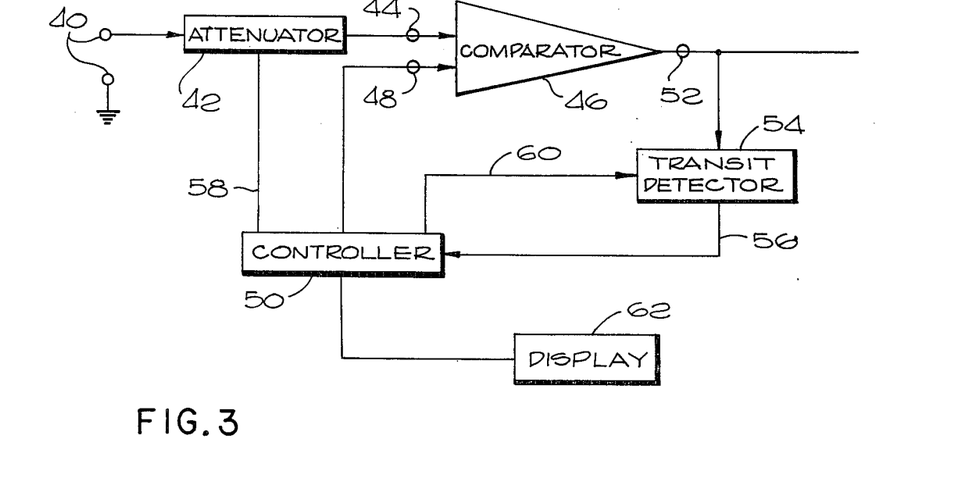
FIG. 3 is a generalized block diagram illustrating the automatic peak detecting apparatus constructed in accordance with the present invention.

An automatic peak value detecting apparatus constructed in accordance with the present invention is illustrated in generalized block diagram form in FIG. 3. As is therein shown the unknown input signal is applied to an input terminal 40 which in turn is coupled to an attenuator 42. The output of the attenuator 42 is coupled to one input terminal 44 of a comparator 46. The other input terminal 48 of the comparator 46 is coupled to a controller 50 which, among other functions, establishes the magnitude of the reference level voltage which is to be applied to the terminal 48 of the comparator 46.

The output terminal 52 of the comparator is connected to a transition detector 54 which is utilized to determine when a predetermined relationship has occurred between the input signal applied at the terminal 44 and the reference signal applied to terminal 48. The transition detector provides an output signal responsive to the occurrence of such predetermined relationships and applies the same by way of the connection 56 to the controller 50. Such information in turn may be applied by way of the connections 58 and 60 to the attenuator 42 and transition detector 54, respectively, to accomplish additional control features as will become more apparent hereinbelow. When the particular desired information regarding the applied input signal, such, for example, as shown in FIG. 2, has been ascertained by the appropriate comparing and detection and, if thereafter required, arithmetic computation, the same is then displayed in the display 62 which is coupled to the controller 50.

Upon application of the unknown time-varying signal, for example, as shown in FIG. 2, to the apparatus as shown in FIG. 3, the instrument is instructed through the utilization of the keyboard 16 to automatically determine the peak values of the input signal and, for example, thereafter set the comparator reference level at the mid-point thereof as is illustrated at (b) of FIG. 2. When such occurs the controller 50 automatically sets the attenuator 42 at the maximum voltage range for which the timer-counter instrument is designed. Subsequently, the reference voltage applied at terminal 48 of the comparator 46 is sequentially stepped in incremental equal steps through the outer limits of the maximum range which do not include the region of that range caused by any lower range of the instrument. In the event no signal is detected by the comparator 46, the controller automatically sets the attenuator 42 at the next lower range for which the instrument is designed. The reference voltage level appearing at the terminal 48 of the comparator 46 is again stepped through the outer portions of this next lower range which do not include the region of that range caused by any lower range sequentially in incremental equal steps, to ascertain whether the applied input signal falls within that range. This sequence of events occurs until the comparator 56 ascertains that indeed the signal applied to the terminals 40 does fall within the particular range to which the attenuator 42 is then set. When such occurs the comparator 46 provides an output signal at the terminal 52, which is detected by the transition detector 54, and applied to the controller by the lead 56 which in turn causes the attenuator 42 to thereafter be retained at the position occupied when the signal was first detected. It will now be recognized by those skilled in the art that through this technique the measuring range of the instrument within which the signal falls has automatically been determined.

Subsequent to determination of the measurement range within which the signal falls, it is desired to then detect the peak values of the signal. To accomplish such detection, the reference level appearing at the terminal 48 of the comparator 46 is again caused to change in incremental equal steps sequentially from the lowest level of the range to which the attenuator is set toward the highest level, that is, the range is swept in the incremental steps until the lower peak of the signal is detected by coincidence between the reference level applied at the terminal 48 and the unknown signal applied at the terminal 44. The value of the peak is then determined through utilization of the output signal 52 which is detected by the detector 54 and applied to the controller indicating that the reference level is at the level where detection has occurred. Such information is then stored. Subsequently the upper peak is ascertained by continuing to sweep the range until an absence of coincidence between the input signal at the terminal 44 and the reference signal at terminal 48 is detected. Again such information is applied through the detector 54 to the controller 50 and stored. Once the upper and lower peaks are thus determined, the controller 50 may then arithmetically compute the mid-point between the upper and lower peaks and apply that value to the terminal 48 of the comparator 46. Again, as will be recognized by those skilled in the art, through the utilization of this technique and the circuit as illustrated in FIG. 3, not only has the range of the wave form as shown in FIG. 2 been ascertained but the precise values of the upper and lower peaks as well as the mid-point thereof. It will also be recognized that such has been done automatically upon command received from the keyboard 16, or the external equipment attached to the interface option 20, without any prior knowledge as to the content or shape of the applied signal by the operator. It is to be understood that any other predetermined voltage point of the wave form can be arithmetically calculated.

Figure 4:
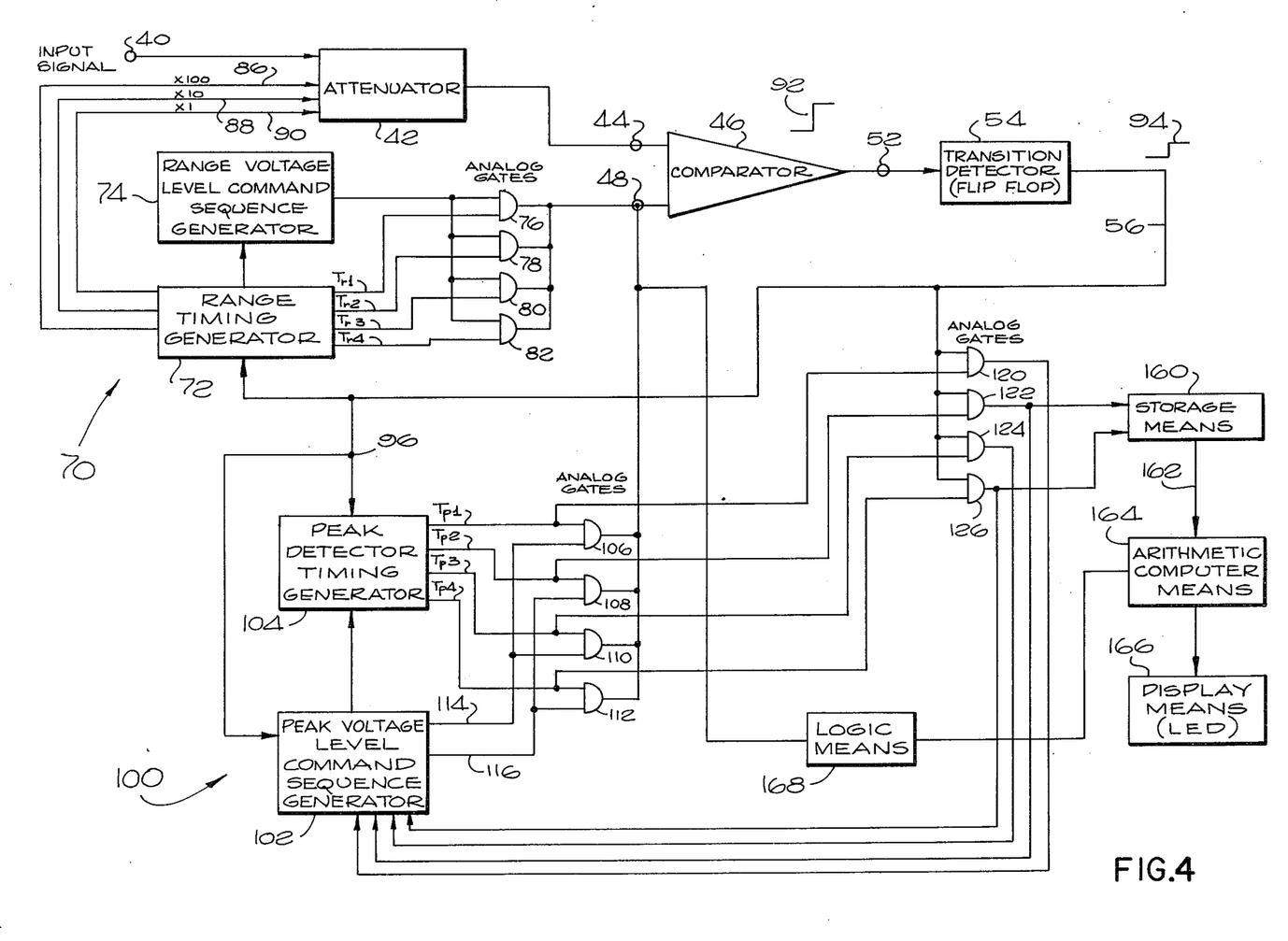
FIG. 4 is a schematic diagram in block form illustrating in greater detail the automatic peak detecting apparatus constructed in accordance with the present invention.

By reference now more specifically to FIG. 4, there is illustrated in greater detail in block form an automatic peak value detecting apparatus constructed in accordance with the present invention. Where appropriate, the same reference numerals utilized in FIG. 3 will also be utilized in FIG. 4. As is illustrated in FIG. 4, the controller 50 as illustrated in FIG. 3 has generally been divided into a ranging section 70 and a peak level detecting section 100. Within the ranging section 70 there is provided a range-timing generator 72 and a range voltage level command sequence generator 74. A plurality of analog gates 76 through 84 are connected to receive signals generated by the range timing generator 72 and the range level generator 74. The output of the analog gates 76 through 84 are connected to the terminal 48 of the comparator 46 to establish the reference voltage or trigger level thereof.

The range voltage generator 74 provides an output signal which is a direct-current voltage which changes in equal incremental steps between predetermined limits upon command from the keyboard 16, or the external equipment. The range timing generator 72 sets the attenuator to the maximum range for the instrument. For example, the times 100 range as illustrated at the input 86 of the attenuator 42. Simultaneously the range voltage generator commences to produce the equal incremental steps direct-current voltage signal which is applied to one terminal of each of the analog gates 76 through 82. The range timing generator will then simultaneously produce sequentially occurring signals $T_{r1}$ through $T_{r4}$ which signals are applied to the other input of the gates 76 through 82, respectively. When a timing signal is applied to the gates 76 through 82, respectively, then the range voltage signal appearing on the other terminal thereof is allowed to pass through the gate and be applied to the terminal 48 of the comparator 46. Thus, for example, when a signal appears at the lead marked $T_{r1}$ of the range timing generator 72, the analog gate 76 is enabled and the range voltage signal appearing at the other input thereof passes through the gate 76 and is applied to the terminal 48. Since no other gate is then enabled, the range voltage signal applied to gates 78–82 is not allowed to pass.

Figure 5:
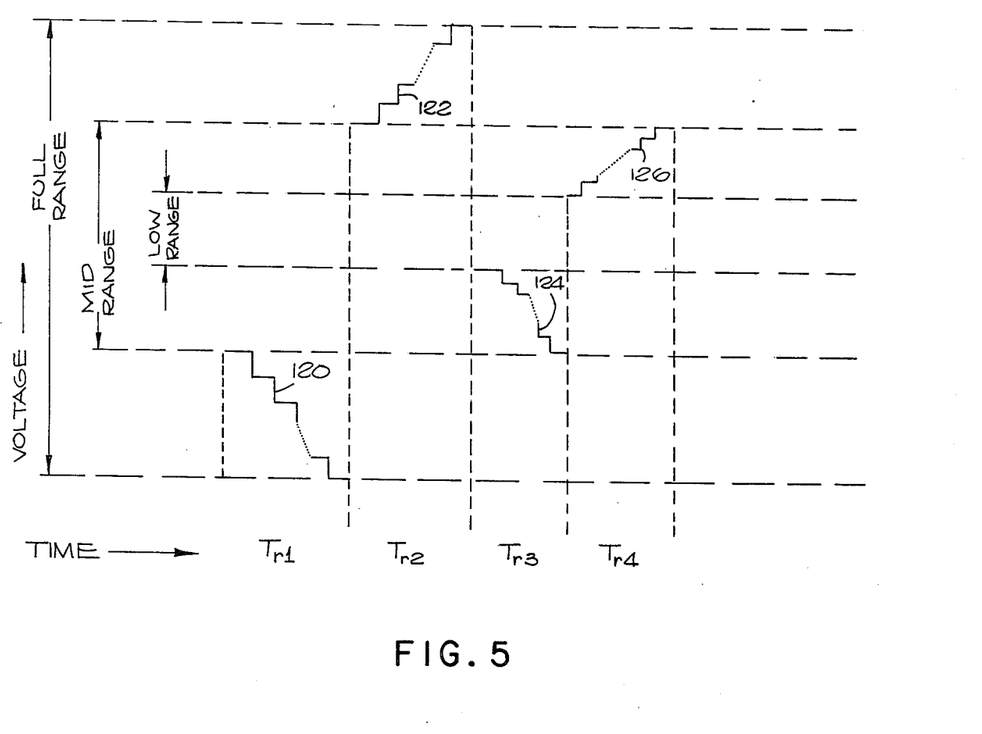
FIGS. 5 and 6 are timing diagrams illustrating the manner in which the reference level voltage is applied to the automatic peak detecting apparatus constructed in accordance with the present invention.

A better understanding of the foregoing may be obtained by reference to FIG. 5 which is a timing diagram illustrating the manner in which the incrementally changing range voltage signal is applied to terminal 48 of the comparator 46. As is illustrated in FIG. 5, the preferred embodiment of the instrument illustrated in FIG. 1 includes three ranges, a full range, a mid-range and a low range. For example, the full range may be from −300 to +300 volts (×100), the mid-range from −30 to +30 volts (×10) and the low range from −3 to +3 volts (×1). Upon initial command from the keyboard 16, the attenuator 42 is set at full range scale and the range voltage generator 74 commences to generate the incrementally changing direct current signal as illustrated at 120 on FIG. 5. Simultaneously a signal from the range timing generator appears at $T_{r1}$ thus enabling the analog gate 76. As a result, during the entire time period illustrated at $T_{r1}$, the signal illustrated at 120 is applied to the terminal 48 of the comparator 46. It should be noted that the signal 120 commences at the outer negative limit of the mid-range and sweeps from that value to the outer negative limit of the full range, that is, the signal 12 increases in value in incremental equal steps.

Assuming no coincidence occurred between the input signal applied to the terminal 44 and the reference signal applied to the terminal 48 of the comparator 46, the range timing generator automatically applies an enabling signal $T_{r2}$ to one terminal of the gate 78. The range voltage generator automatically cycles to provide the incrementally changing signal as shown at 122 which merely is the signal shown at 120 with the polarity changed thus causing the signal 122 to sweep from the outer positive limit of the mid-range to the outer positive limit of the full range. In the event no input signal is detected during this sweep the range timing generator automatically sets the attenuator to the mid-range or the times 10 (×10) as shown at the lead 88 at the input of the attenuator 42 and produces a signal at $T_{r3}$ which is applied to enable the gate 80. At this point in time the range voltage generator 74 recycles and produces the signal 124 which is applied to all of the gates 76 through 82 and since gate 80 is enabled passes to the input terminal 48 of the comparator 46. Again, in the absence of any coincidence between signals applied to the input terminals 44 and 48, the range voltage generator applies the signal 126 through the gate 82 which is enabled by a signal appearing at $T_{r4}$. It will be noted by reference to FIG. 5 that the signal 124 sweeps from the outer negative limit of the low range to the outer negative limit of the mid-range of the instrument while the signal 126 sweeps from the outer positive limit of the low range to the outer positive limit of the mid-range of the instrument, that is, increasing in value in incremental equal steps. After the expiration of the time period $T_{r4}$ the entire range of the instrument, with the exception of the low range, has now been investigated for the presence of an input signal falling therewithin. In the event that no signal has been detected then the range timing generator produces a signal which sets the instrument to the lowest range since this range is the only range left within which the input signal may fall.

In the preferred embodiment of the present invention the incremental levels of change of the signals 120 through 126 during the range search vary at a rate of approximately 3% of the range being investigated. It will be recognized by those skilled in the art that through the utilization of the attenuator 42, the signal applied at the terminal 48 through each of the gates may have the same absolute magnitude through each of the sweeps. For example, the signal 120 may in fact be a voltage varying from −0.3 volts to −3 volts in incremental steps of 0.1 volts. Nonetheless, by applying the times 100 (×100) full range factor thereto, insofar as the input signal is concerned, an investigation is being conducted of the area between −30 volts and −300 volts. Similar analysis is available as to the times 10 (×10) range.

Figure 7:
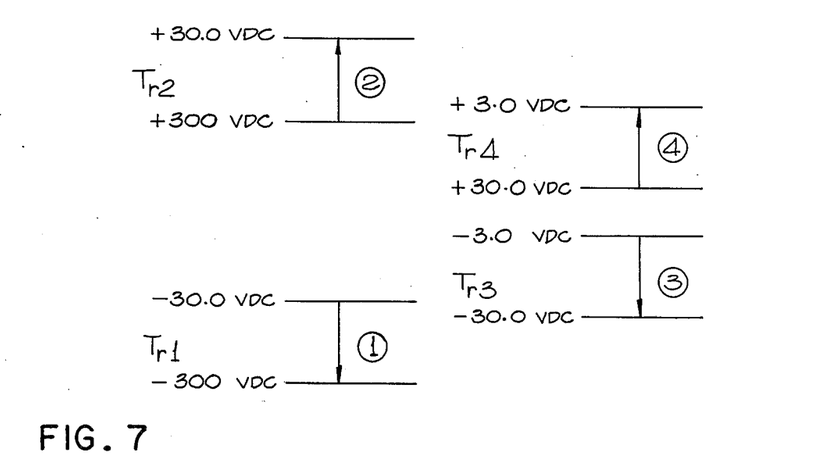
FIG. 7 is a simplified diagram illustrative of the information as contained in FIG. 5.

The foregoing range searching is further illustrated in more simplified form in FIG. 7 to which reference is now made. As is therein illustrated, during the full range search the first step is to search between −30 volts and −300 volts D.C. which is during the time period $T_{r1}$. The second step is to search between +30 and +300 volts D.C. which is during the time period $T_{r2}$. During $T_{r3}$ the third search sequence occurs between −3 and −30 volts D.C. while the range between +3 and +30 volts D.C. is searched at the fourth step during $T_{r4}$. If no signal is found during the full or mid-range search then the signal, if one in fact is applied, and is within the limits of design of the instrument, must fall within the low range. Of course, when the mid-range is searched and no coincidence occurs to indicate the presence of an input signal within that range, the range timing generator automatically steps the attenuator to the low range or times 1 (×1) as is indicated at the input 90 to the attenuator 42.

It will now be assumed that during one of the foregoing searches a signal was in fact detected, and for purposes of further description it will be assumed that the signal was detected during the time $T_{r4}$ while the signal 126 was applied to the terminal 48. Upon the coincidence of the signals appearing at the terminals 44 and 48 of the comparator 46 the output appearing at the terminal 52 of the comparator changes states, that is, from a low level to a high level as is indicated by the wave form 92. This change of state is applied to the transition detector 54 which may, for example, be a bi-stable multivibrator (a flip flop) which in turn is caused to change states, for example, applying a high level signal at the lead 56 as is indicated by the wave form 94. The high level signal 94 is applied by the lead 56 to the range timing generators 72 as an inhibit signal to preclude further generation of timing signals and to preclude a further change of the attenuator 42 setting; that is, upon detection of range of the unknown signal applied to the input terminal 40, the level of the attenuator is fixed and the range searching sequence is terminated. Simultaneously the positive or high signal 94 is applied by way of the lead 96 to the peak voltage level command sequence generator 102 and the peak detector timing generator 104 as an enabling signal therefor. A plurality of analog gates 106 through 112 are connected to receive signals from the peak detector timing generator and the peak voltage generator and are also connected so that the output from the gates is applied to the input terminal 48 of the comparator 46. The peak detector timing generator 104 operates similar to the range timing generator in that a sequence of signals are applied as indicated at $T_{p1}$ through $T_{p4}$ to sequentially activate or enable the gates 106 through 112, respectively. During the time that the particular gate is thus enabled a signal applied to its other input from the peak voltage generator is allowed to pass and be applied as the reference level (or trigger level) to terminal 48 of the comparator 46. The peak voltage generator produces two types of signals, a coarse signal and a fine signal. The coarse signal is applied by way of the lead 114 as an input to the gates 106 and 110. The fine signal is applied by way of the lead 116 as an input signal to the gates 108 and 112.

The purpose of the peak detecting portion 100 of the system is to ascertain the peak values of the negative and positive peaks of the applied input signal. This is accomplished by first sweeping across the appropriate range with coarse reference level steps until the negative peak of the input signal has been detected and immediately thereafter sweeping the precise area where the negative peak exists with a fine sweep to more accurately determine the value of the negative peak. Subsequently thereto the positive peak is determined in similar fashion.

When the negative peak is determined during the coarse sweep of the appropriate range the same is indicated by a change of state at the output of the comparator 46 as indicated by the signal 92 which is then applied to the transition detector (flip flop) 54, which was reset to its original state when the peak detector timing generator and peak voltage generator were enabled. The change of state at the output as shown by the signal 94 is then applied to the analog gates 120 through 126. It will also be noted that the timing signals $T_{p1}$ through $T_{p4}$ are also applied sequentially to the gates 120 through 126, respectively. Thus at the point during activation of the gate 120 when the negative peak of the applied signal is detected during the coarse sweep an output signal is applied from the gate 120 to the peak voltage generator causing the same to change from the coarse to the fine sweep signals. Simultaneously the peak detector timing generator also generates a timing signal at $T_{p2}$ which is applied to the gates 108 and 122 to enable them. The fine sweep commences at the voltage level preceding the one during which the negative peak was detected and will commence to sweep in incremental equal steps much smaller than those used during the coarse sweep. In accordance with the preferred embodiment of the present invention such fine incremental steps will be at approximately 0.3% of the value of the range within which the signal appeared. Upon detection, by coincidence of the input and reference level signals, during the fine sweep of the negative peak of the input signal an output signal is again generated by the comparator 46 as indicated at 92 and it is detected by the transition detector (flip flop) and is applied to the gates 120 through 126. Gate 122 is enabled by application of the signal $T_{p2}$ thereto and thus passes the signal from the output thereof to the peak voltage level command sequence generator 102 causing it to reset to the coarse sweep voltage and also to cause the peak detector timing generator to now step to the timing period $T_{p3}$ which enables the gates 110 and 124. A similar coarse sweep now continues from the negative peak level of the input signal and continues toward the positive peak thereof for purposes of detecting the positive peak value of the input signal. When such occurs the fine sweep again results to pinpoint the value of the positive peak. The sequencing is similar to that above described but in this instance varies somewhat in that an absence of coincidence is being sought as to signals appearing at terminals 44 and 48 of the comparator 46 is opposed to the presence of coincidence; that is, the transition detector 54 will continue to detect transition at each level of the coarse signal applied through the gate 110 to the terminal 48 during the entire period of time when the existence of an input signal corresponding to the trigger level at the terminal 48 occurs. When no transition detector signal is obtained the absence thereof is detected by the absence of such a transition signal at the output of the gate 124 thus causing the peak voltage generator to reset to the fine sweep signal at 116 and to cause the peak detector timing generator to step to the time $T_{p4}$.

Figure 6:
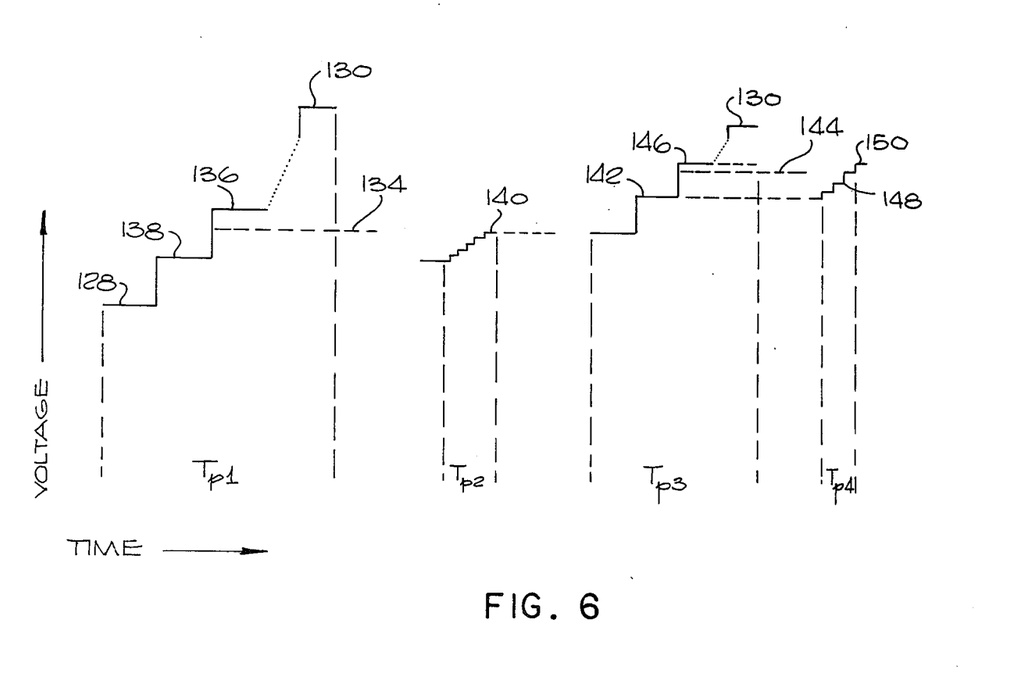

It will become more apparent by reference to FIG. 6 which illustrates a timing diagram showing the application of the peak voltage level generator output signal to the terminal 48 of the comparator 46 at the various times during the timing signals $T_{p1}$ through $T_{p4}$.

As above indicated the signal 128 would commence at the most negative portion of the mid-range (where the signal was discovered) and would, during the time period $T_{p1}$, range in coarse steps of approximately 1 volt each toward the +30 volts upper positive limit as illustrated at 130. It will be assumed for purposes of this discussion that the most negative peak of the signal, for example, as shown in FIG. 2 at 132, occurs at the dotted line 134 on FIG. 6. Since the negative peak occurs at the voltage level shown at 134 it would first be detected when the coarse peak voltage level signal is at the level illustrated at 136. As above indicated when the coincidence occurs the output signal applied to the analog gate 120 causes the peak voltage command generator to transfer to the fine sweep voltage and the peak detector timing generator to switch to the time $T_{p2}$. When such occurs the peak voltage level command sequence generator commences generating a signal at the level immediately preceding the one where the input signal was detected. In this case, that level would be at a position shown at 138. During the time period $T_{p2}$ the peak voltage generator generates the fine sweep and in accordance with the preferred embodiment of the present invention, each of the incremental steps shown at $T_{p2}$ would be approximately 0.1 volts in magnitude. When the fine sweep reaches the position corresponding to the level shown at 134, as is illustrated at 140, the actual value of the negative peak 132 of the signal is then detected. As above indicated this detection is noted by the transition detector and the signal is passed through the gate 122 to the peak voltage level command sequence generator and the peak detector timing generator causing a transfer to the time period $T_{p3}$ and to the coarse sweep. When such occurs the coarse sweep applied at lead 114 and through gate 110 to the terminal 48 of the comparator 46 is as shown at 142 on FIG. 6. As is therein indicated the coarse sweep now commences at the value of the negative peak 132 of the input signal and continues to sweep upwardly toward the upper limit 130 of the mid-range of the instrument. It will now be assumed that the upper peak of the signal is as illustrated at 144 on FIG. 6. Thus during the existence of the signal at the terminal 48 through the level shown at 142 an output signal is detected by the comparator indicating an existence of the input signal thereto. However, when the reference level signal is changed to the level shown at 146 no output signal is detected. Thus the absence of an output signal through the gate 124 is noted and is applied to the peak voltage level command sequence generator causing it to reset to the level at 142 and the peak timing generator to transfer to the timing period $T_{p4}$ and the fine sweep voltage to commence to be generated as is illustrated at 148.

When the fine sweep reaches the signal level at 144 which is the positive peak of the wave form as applied, there will, in fact, be a transition detected. However, when the next level shown at 150 is reached, there will be no transition detected. This lack of transition is again noted at the gate 126 and is applied to the peak voltage generator and peak detector timing generator indicating that the upper peak has been detected at the level 144.

Upon the detection of the lower and upper peaks of the applied input signal and the generation of the signals at the output of the gates 122 and 126 the voltage level of the output of the peak voltage generator 102 is applied to a storage means 160. Upon completion of the detection of the peak values the values in the storage means are applied by way of the lead 162 to the arithmetic computer means 164 which then determines the midpoint on the wave form as shown in FIG. 2 and displays the same in the display means 166. In addition thereto the midpoint as shown at (b) of FIG. 2 is also applied through appropriate logic means 168 as the reference or trigger level signal to the terminal 48 of the comparator 46. It will be recognized by those skilled in the art that the computer means 164 may generate any trigger levels desired such as those at (a), (b) or (c) of FIG. 2 and apply the same through the appropriate logic means to the comparator 46.

Figure 8:
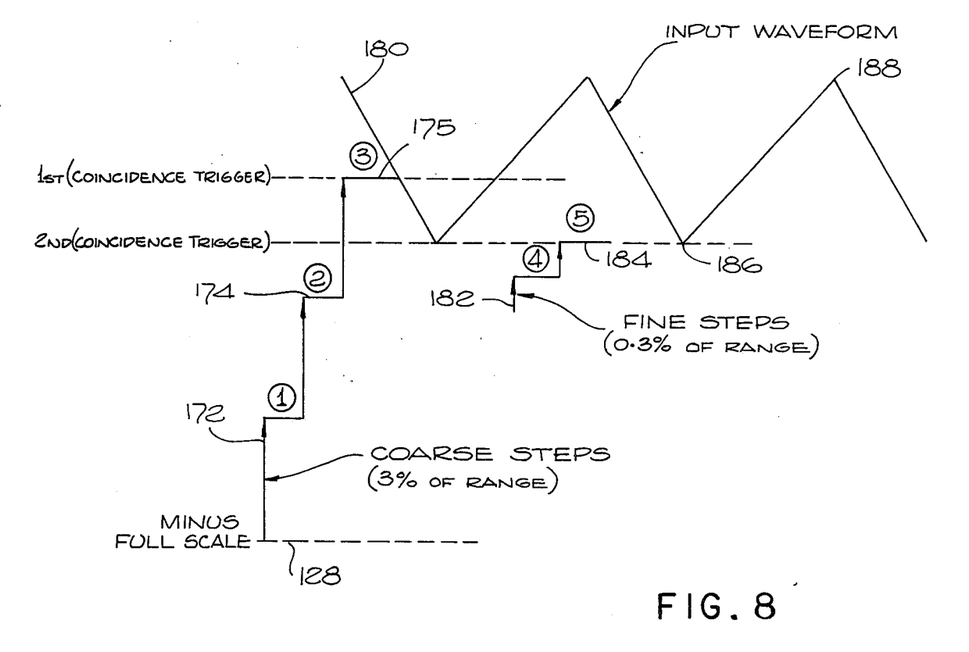
FIG. 8 is a simplified diagram illustrative of the material contained on FIG. 6.

By reference to FIG. 8 a more simplified illustration of the coarse and fine sweeps for purposes of detecting the negative peak of an input wave form is illustrated. As is therein shown the sweep starts at the minus full scale for the range as set as is shown at 128. The sweep then progresses in the coarse steps of approximately 3% of range as illustrated at 172 and 174 until it reaches the level illustrated at 175. At the level 175 there is a coincidence between the trigger level voltage established at the point 175 and the input wave form as shown at 180. Such coincidence is detected as above indicated and such detection transmitted to the peak voltage generator and the peak timing generator to cause the generation of the fine steps at approximately 0.3% of the range and is illustrated at 182 and commencing at the level of the last previous coarse step 174. When the fine steps reach the point shown at 184 the negative peak 186 of the input wave form 180 is established. At this point the subsequent coarse and fine sweeps are utilized to detect the positive peak 188 as above described.

Those skilled in the art will recognize that the means for applying the range voltage level signals to the terminal 48 of the comparator 46, including the timing signals, and the gates, may include various well known structure. For example, stepping switches and voltage dividers may be utilized, or alternatively precision potentiometers driven with appropriate power and feedback signals, or alternatively appropriate read only memory (ROM) circuits with the usual logic circuits and a digital to analog converter may be utilized. Similar structures may be utilized for the peak detector timing generator and the peak voltage level command sequence generators as will be well understood by those skilled in the art. As a result, and for simplicity of illustration and clarity of description, the detailed structure which could be used has not been shown or described except by way of the block diagram and descriptive material hereinabove set forth.

The foregoing description and illustration has been of a single channel of a peak value automatic detecting apparatus which may be utilized within the instrument as illustrated in FIG. 1. Those skilled in the art will recognize that a plurality of channels may be used and included within any timer-counter instrument as may be desired.

We claim:

1. Apparatus having a plurality of ranges for automatically detecting the peak values of an applied unknown electrical signal the magnitude of which varies as a function of time comprising:
   A. comparator means having first and second input terminals and an output terminal;
   B. means for applying said unknown signal to said first input terminal of said comparator means;
   C. detector means connected to said output terminal for providing detection signals responsive to output signals from said comparator;
   D. means for generating a plurality of voltage levels, each representative of a predetermined range of said apparatus, each of said voltage levels having a sequentially changing direct-current voltage, said changes occurring in predetermined equal increments, means for applying said voltage levels to said second input terminal of said comparator, thereby to provide a reference level signal against which said unknown signal is compared;
   E. said comparator means providing a first signal at the output terminal thereof in response to a first predetermined relationship between said reference level signal and said unknown signal representative of one peak of said unknown signal and a second signal at the output terminal thereof responsive to a second predetermined relationship between said reference level signal and said unknown signal representative of the other peak of said unknown signal, said voltage level signals being applied to said second terminal of said comparator consecutively from the level representative of the largest range of said apparatus to the level representative of the lowest range of said apparatus in the absence of a detection signal responsive to said first output signal.

2. Apparatus as defined in claim 1 which further includes display means, and means connecting said display means to said comparator means for displaying values representative of said applied signal.

3. Apparatus as defined in claim 1 which further includes arithmetic computer means, means connecting said arithmetic computer means to said comparator means for determining a predetermined desired value level of said applied signal, and display means connected to said arithmetic computer means for displaying said value level.

4. Apparatus as defined in claim 1 wherein said means for applying said unknown signal includes an attenuator means for providing said plurality of ranges for said apparatus.

5. Apparatus for automatically detecting the peak values of an applied unknown electrical signal the magnitude of which varies as a function of time comprising:
  A. comparator means having first and second input terminals and an output terminal;
  B. means including range level setting means for applying said unknown signal to said first input terminal of said comparator means;
  C. means for generating a sequentially changing direct-current voltage, said changes occurring in predetermined equal increments;
  D. means for applying said direct-current voltage signal to said second input terminal of said comparator as a reference level signal against which said applied signal is compared for a first predetermined time period during which the range level of said applied signal is determined;
  E. means for automatically changing said range level setting means to a different range setting in the absence of a signal at said output terminal of said comparator a second predetermined period of time after said direct-current signal is applied to said first terminal of said comparator;
  F. means for inhibiting said automatic range changing means responsive to a signal at said output terminal of said comparator during said first predetermined time period thereby establishing the range setting for said applied signal;
  G. means for applying said direct-current signal to said second input terminal of said comparator as a reference level signal against which said applied signalis compared for a third predetermined time period during which the value of one peak of said applied signal is determined; and
  H. means for applying said direct-current signal to said second input terminal of said comparator as a reference level signal against which said applied signal is compared for a fourth predetermined time period during which the value of the other peak of said applied signal is determined.

6. Apparatus as defined in claim 5 wherein said means for applying said direct-current signal to determine said one peak of said applied signal further includes means for sweeping said established range with said direct-current signal from one extreme toward the other thereof until coincidence between said applied signal and said reference signal is first detected during said third predetermined time.

7. Apparatus as defined in claim 6 wherein said means for sweeping include means for establishing said equal increments of said direct-current voltage at a first level for sweeping from said one extreme toward said other and a second means for setting said increments at a second value which is less than the first value thereof in response to said first detection of said coincidence between said applied signal and said reference signal, said second level commencing at a value corresponding to the level of said first value immediately preceding said first detection of coincidence.

8. Apparatus as defined in claim 6 wherein said means for applying said direct-current signal during said fourth predetermined time period includes means for detecting the absence of a signal at said output terminal of said comparator means subsequent to the presence of a signal at said output terminal of said comparator means.

9. Apparatus as defined in claim 5 wherein said means for applying said direct-current signal to determine said one peak of said applied signal further includes means for sweeping said established range with said direct-current signal from one extreme toward the other thereof until coincidence between said applied signal and said reference signal is first detected during said third predetermined time, said means for applying said direct current signal during said fourth predetermined time period includes means for detecting the absence of a signal at said output terminal of said comparator means subsequent to the presence of a signal at said output terminal of said comparator means, and means for setting said means for generating said direct-current signal to start said direct-current signal during said fourth predetermined time at the level wherein said coincidence between said applied signal and said reference signal is first detected during said third predetermined time.

10. Apparatus as defined in claim 9 wherein said means for applying said direct-current signal during said third predetermined time includes means for establishing said equal increments of said direct-current voltage at a first level for sweeping from said one extreme toward said other and a second means for setting said increment at a second value which is less than the first value thereof in response to said first detection of said coincidence between said applied signal and said reference signal, said second level commencing at a value corresponding to the level of said first value immediately preceding said first detection of coincidence, said means for establishing said direct current voltage during said fourth predetermined time period includes means for establishing said equal increments of said direct-current voltage at a first level equal to the level and wherein said first coincidence occurred and a third means for setting said increments at a third value which is less than the first value thereof in response to detection of lack of coincidence between said applied signal and said reference signal, said third level commencing at a value corresponding to the value of said direct-current voltage at said first level immediately preceding said failure to detect coincidence between said applied signal and said reference signal.

11. Apparatus as defined in claim 5 which further includes storage means and means for connecting said storage means to said second input terminal of said comparator means.

12. Apparatus as defined in claim 11 which further includes display means and means connecting said storage means to said display means.

13. Apparatus as defined in claim 11 wherein said means connecting said storage means to said comparator means further include arithmetic computer means.

14. Apparatus as defined in claim 13 which further includes logic means connected between said arithmetic computer means and said second input terminal of said comparator means.

15. Apparatus as defined in claim 14 which further includes display means connected to said arithmetic computer means.

* * * * *